(12) United States Patent
Cai et al.

(10) Patent No.: US 11,075,659 B2
(45) Date of Patent: Jul. 27, 2021

(54) POWER ADJUSTMENT METHOD AND APPARATUS

(71) Applicant: HUAWEI TECHNOLOGIES CO., LTD., Guangdong (CN)

(72) Inventors: Meng Cai, Chengdu (CN); Kun Li, Chengdu (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/991,725

(22) Filed: Aug. 12, 2020

(65) Prior Publication Data

US 2020/0373950 A1 Nov. 26, 2020

Related U.S. Application Data

(63) Continuation of application No. PCT/CN2018/076439, filed on Feb. 12, 2018.

(51) Int. Cl.
| | |
|---|---|
| *H04L 1/00* | (2006.01) |
| *H04B 1/04* | (2006.01) |
| *H03F 1/32* | (2006.01) |

(52) U.S. Cl.
CPC .............. *H04B 1/04* (2013.01); *H03F 1/3241* (2013.01); *H03F 2201/3233* (2013.01);
(Continued)

(58) Field of Classification Search
CPC .... H03F 2200/451; H03F 3/245; H03F 3/195; H03F 1/3247; H03F 3/19;
(Continued)

(56) References Cited

U.S. PATENT DOCUMENTS

| | | |
|---|---|---|
| 5,900,927 A | 5/1999 | Hasegawa |
| 9,276,533 B2 | 3/2016 | Lozhkin |
| (Continued) | | |

FOREIGN PATENT DOCUMENTS

| | | |
|---|---|---|
| CN | 101478522 A | 7/2009 |
| CN | 102098247 A | 6/2011 |
| (Continued) | | |

OTHER PUBLICATIONS

PCT International Search Report and Written Opinion issued in International Application No. PCT/CN2018/076439 dated Nov. 22, 2018, 17 pages (with English translation).
(Continued)

*Primary Examiner* — Eva Y Puente
(74) *Attorney, Agent, or Firm* — Fish & Richardson P.C.

(57) ABSTRACT

This application provides a power adjustment method and apparatus. The method includes obtaining a to-be-output signal, performing first automatic gain control (AGC) processing on the to-be-output signal to obtain the to-be-output signal on which the first AGC processing is performed, and to obtain a gain value of the to-be-output signal. The method also includes performing digital pre-distortion (DPD) processing on the to-be-output signal on which the first AGC processing is performed, to obtain the to-be-output signal on which the DPD processing is performed. The method further includes calculating an output power back-off (OBO) value based on the gain value, adjusting, based on the OBO value, output power of the to-be-output signal on which the DPD processing is performed, and sending, to a signal receive end, the to-be-output signal on which the power adjustment is performed.

20 Claims, 6 Drawing Sheets

(52) U.S. Cl.
CPC ............... *H04B 2001/0425* (2013.01); *H04B 2001/0433* (2013.01); *H04L 1/0041* (2013.01)

(58) Field of Classification Search
CPC .. H03F 2200/102; H03F 1/0227; H03F 3/193; H03F 3/68; H03F 1/0288; H03F 3/211; H03F 1/3241; H04L 1/0041; H04L 1/0071; H04L 27/2613; H04L 27/2605; H04L 1/0057; H04L 1/0065; H04L 27/2614; H04L 5/0007; H04L 1/0061; H04L 1/0064; H04L 1/0076; H04B 1/0475; H04B 1/40; H04B 2001/0425; H04B 1/04; H04B 2001/0408; H04B 2001/045; H04B 1/16; H04B 2001/0433; H04B 7/0452; H04B 7/0456; H04B 17/13; H04B 17/318
USPC .......................................................... 375/262
See application file for complete search history.

(56) References Cited

U.S. PATENT DOCUMENTS

| | | | | |
|---|---|---|---|---|
| 2009/0310705 | A1* | 12/2009 | Fujimoto | H04L 27/366 375/296 |
| 2013/0279629 | A1 | 10/2013 | Seller | |
| 2014/0133531 | A1* | 5/2014 | Nguyen | H03F 1/3241 375/219 |
| 2015/0028947 | A1 | 1/2015 | Lozhkin | |
| 2018/0351587 | A1* | 12/2018 | Nammi | H04B 7/0413 |
| 2019/0059060 | A1* | 2/2019 | Chen | H04W 52/367 |

FOREIGN PATENT DOCUMENTS

| | | |
|---|---|---|
| CN | 102394845 A | 3/2012 |
| CN | 102420573 A | 4/2012 |
| CN | 103391057 A | 11/2013 |
| EP | 2019491 A1 | 1/2009 |
| JP | 2012186568 A | 9/2012 |
| KR | 20150046508 A | 4/2015 |
| WO | 9220146 A1 | 11/1992 |

OTHER PUBLICATIONS

Extended European Search Report issued in European Application No. 18905122.0 dated Jan. 11, 2021, 11 pages.
Office Action issued in Chinese Application No. 201880087957.0 dated May 8, 2021, 6 pages.

* cited by examiner

POWER ADJUSTMENT METHOD AND APPARATUS

CROSS-REFERENCE TO RELATED APPLICATIONS

This application is a continuation of International Application No. PCT/CN2018/076,439, filed on Feb. 12, 2018, the disclosure of which is hereby incorporated by reference in its entirety.

TECHNICAL FIELD

This application relates to the communications field, and more specifically, to a power adjustment method and apparatus.

BACKGROUND

A cloud radio access network (C-RAN) is a network architecture that is based on a centralized baseband unit (BBU) and a distributed remote radio unit (RRU). A common public radio interface (CPRI) is a most important interface form between the BBU and the RRU.

In a conventional microwave CPRI bearer, in-phase and quadrature (in-phase and quadrature, I/Q) data and a control word (CW) that are in the CPRI are both considered as bit streams for transmission, and a relatively large bandwidth resource is required. This brings great pressure to a CPRI transmission pipe. Confronting this challenge, an efficient wireless fronthaul (EWF) technology emerges, and about 1.228 Gbps CPRI data may be transmitted by using a 28 MHz spectrum bandwidth without using a multi-input multi-output (MIMO) technology or a cross-polarization interference cancellation (XPIC) technology. This transmission efficiency is about five times that of conventional microwave technology.

A power amplifier (PA) is a main non-linear source in a microwave communications system. Due to a non-linear feature of the power amplifier, after a signal passes through the power amplifier, in-band distortion is generated and performance of the communications system deteriorates. A digital pre-distortion (DPD) algorithm performs pre-distortion processing on in-band distortion information of the power amplifier, to reduce the non-linearity of the power amplifier.

When the EWF technology is combined with the DPD algorithm, third-order intermodulation distortion (IMD3) spectrum performance or error vector magnitude (EVM) performance of an I/Q signal deteriorates. In the prior art, back-off is fixedly performed on the output power of the power amplifier, to reduce the non-linearity of the power amplifier, and to improve the IMD3 spectrum performance and the EVM performance of the I/Q signal. However, in an actual CPRI bearer scenario, CPRI I/Q traffic changes in real time, and that back-off is fixedly performed on output power of the power amplifier in the prior art cannot effectively improve the IMD3 spectrum performance and the EVM performance of the I/Q signal.

SUMMARY

This application provides a power adjustment method and apparatus, resolving a problem that IMD3 spectrum performance and EVM performance of an I/Q signal cannot be effectively improved.

According to a first aspect, an embodiment of this application provides a power adjustment method, including: obtaining a to-be-output signal; performing first automatic gain control AGC processing on the to-be-output signal to obtain the to-be-output signal on which the first AGC processing is performed, and to obtain a gain value of the to-be-output signal; performing digital pre-distortion DPD processing on the to-be-output signal on which the first AGC processing is performed, to obtain the to-be-output signal on which the DPD processing is performed; calculating an output power back-off OBO value based on the gain value; adjusting, based on the OBO value, output power of the to-be-output signal on which the DPD processing is performed; and sending, to a signal receive end, the to-be-output signal on which the power adjustment is performed.

According to a technical solution in this embodiment of this application, the output power of the to-be-output signal is adjusted based on the OBO value. Because the OBO value is calculated based on the gain value, and the gain value corresponds to traffic, in this embodiment of this application, the output power of the to-be-output signal may be adjusted in real time based on a change of the traffic to reduce non-linearity of a power amplifier, thereby improving the IMD3 spectrum performance and the EVM performance of the I/Q signal.

In some possible implementations, after the performing digital pre-distortion DPD processing on the to-be-output signal on which the first AGC processing is performed, the method further includes: performing second AGC processing on the to-be-output signal on which the DPD processing is performed.

Before the DPD processing is performed, the first AGC processing is performed on the to-be-output signal, so that an energy fluctuation caused by partial CPRI I/Q traffic may be adjusted, and the second AGC processing is performed on the to-be-output signal on which the DPD processing is performed, so that an energy fluctuation output after the DPD processing may be adjusted. In this way, the energy fluctuation caused by the partial CPRI I/Q traffic and the energy fluctuation output after the DPD processing may be decoupled, thereby improving the IMD3 spectrum performance and a transmission distance.

In some possible implementations, the adjusting, based on the OBO value, output power of the to-be-output signal on which the DPD processing is performed includes: adjusting, based on the OBO value and a preset amplification factor, the output power of the to-be-output signal on which the DPD processing is performed.

In some possible implementations, the adjusting, based on the OBO value and a preset amplification factor, the output power of the to-be-output signal on which the DPD processing is performed includes: adjusting the output power to a first value, where the first value is obtained by subtracting the OBO value from a product of the output power and the preset amplification factor.

In some possible implementations, the adjusting of the output power to a first value includes: adjusting the output power to the first value if the product of the output power and the preset amplification factor is greater than a first threshold.

The product of the output power and the preset amplification factor is compared with the first threshold, instead of adjusting the output power in any case, the signal transmit end may adjust the output power when the product of the output power and the preset amplification factor is greater than the first threshold, thereby avoiding a problem that the output power is excessively large or excessively small. In this way, the output power may be within a proper range.

In some possible implementations, the adjusting, based on the OBO value and a preset amplification factor, the output power of the to-be-output signal on which the DPD processing is performed further includes: adjusting, based on the OBO value, the preset amplification factor, and an adjustment amount that is fed back by the signal receive end, the output power of the to-be-output signal on which the DPD processing is performed.

In some possible implementations, the adjusting, based on the OBO value, the preset amplification factor, and an adjustment amount that is fed back by the signal receive end, the output power of the to-be-output signal on which the DPD processing is performed includes: adjusting the output power to a second value, where the second value is obtained by subtracting the OBO value from a third value, and the third value is obtained by adding the adjustment amount to a product of the output power before adjustment and the preset amplification factor.

In some possible implementations, the adjusting of the output power to a second value includes: adjusting the output power to the second value if the third value is greater than a first threshold.

When the third value is greater than the first threshold, the signal transmit end may adjust the output power to the second value. In this way, the output power may be within a proper range, power can be reduced, and the non-linearity of the power amplifier can be reduced.

In some possible implementations, the first threshold is maximum power used when the to-be-output signal on which the DPD processing is performed is sent at lowest traffic.

In some possible implementations, the OBO value $C=10*\lg(1/G^2)$, where C is the OBO value, and G is the gain value.

The gain value corresponds to the change of the traffic. The OBO value is calculated based on the gain value so that the OBO value corresponds to the traffic.

In some possible implementations, before the obtaining a to-be-output signal, the method further includes: obtaining a common public radio interface CPRI data flow, where the CPRI data flow includes an in-phase and quadrature I/Q signal and a control word CW signal; separating the I/Q signal and the CW signal that are in the CPRI data flow; encoding and mapping the separated CW signal to obtain a mapped signal; performing compression and filtering on the separated I/Q signal; and combining the mapped signal with the compressed and filtered I/Q signal to obtain the to-be-output signal.

In the foregoing technical solution, the I/Q signal and the CW signal that are in the CPRI data flow are separated. After being processed, the I/Q signal and the CW signal are combined for transmission, so that a transmission rate of the CPRI may be multiplied.

According to a second aspect, an embodiment of this application provides a power adjustment apparatus, including:

a first automatic gain control AGC amplifier, configured to obtain a to-be-output signal, and perform first AGC processing on the to-be-output signal to obtain the to-be-output signal on which the first AGC processing is performed, and to obtain a gain value of the to-be-output signal;

a digital pre-distortion DPD calculator, configured to perform DPD processing on the to-be-output signal that passes the first AGC amplifier, to obtain the to-be-output signal on which the DPD processing is performed;

an output power back-off OBO value calculator, configured to calculate an OBO value based on the gain value obtained by the first AGC amplifier; and a power amplifier, configured to adjust, based on the OBO value obtained by the OBO value calculator, output power of the to-be-output signal that passes the DPD calculator; and send, to a signal receive end, the to-be-output signal on which the power adjustment is performed.

In some possible implementations, the power adjustment apparatus further includes a second AGC amplifier, configured to perform second AGC processing on the to-be-output signal that passes the DPD calculator.

In some possible implementations, the power amplifier is specifically configured to adjust, based on the OBO value obtained by the OBO value calculator and a preset amplification factor, the output power of the to-be-output signal that passes the DPD calculator.

In some possible implementations, the power amplifier is specifically configured to adjust the output power to a first value, where the first value is obtained by subtracting the OBO value from a product of the output power and the preset amplification factor.

In some possible implementations, the power amplifier is specifically configured to adjust the output power to the first value if the product of the output power and the preset amplification factor is greater than a first threshold.

In some possible implementations, the power adjuster is specifically configured to adjust, based on the OBO value, the preset amplification factor, and an adjustment amount that is fed back by the signal receive end, the output power of the to-be-output signal that passes the DPD calculator.

In some possible implementations, the power amplifier is specifically configured to adjust the output power to a second value, where the second value is obtained by subtracting the OBO value from a third value, and the third value is obtained by adding the adjustment amount to a product of the output power before adjustment and the preset amplification factor.

In some possible implementations, the power amplifier is specifically configured to adjust the output power to the second value if the third value is greater than a first threshold.

In some possible implementations, the first threshold is maximum power used when the to-be-output signal on which the DPD processing is performed is sent at lowest traffic.

In some possible implementations, the OBO value $C=10*\lg(1/G^2)$, where C is the OBO value, and G is the gain value.

In some other possible implementations, the power adjustment apparatus further includes:

a separator, configured to obtain a common public radio interface CPRI data flow, where the CPRI data flow includes an in-phase and quadrature I/Q signal and a control word CW signal; and separate the I/Q signal and the CW signal that are in the CPRI data flow;

a mapper, configured to encode and map the CW signal that passes the separator, to obtain a mapped signal;

a compressor, configured to perform compression and filtering on the I/Q signal that passes the separator; and a multiplexer, configured to combine the mapped signal that passes the mapper with the I/Q signal that passes the compressor, to obtain the to-be-output signal.

According to a third aspect, an embodiment of this application further provides a power adjustment apparatus, where the power adjustment apparatus includes a processor, configured to implement functions in the methods described in the first aspect. The power adjustment apparatus may further include a memory configured to store a program instruction and data. The memory is coupled to the processor. The processor may invoke and execute the program instruction stored in the memory, and is configured to implement functions of the power adjustment apparatus in the methods described in the first aspect. The power adjustment apparatus may further include a transceiver, configured to receive power that is of a to-be-output signal and that is fed back by a receive end of the to-be-output signal.

According to a fourth aspect, an embodiment of this application provides an RRU, configured to perform the methods according to the first aspect or any possible implementation of the first aspect.

According to a fifth aspect, an embodiment of this application provides a BBU, configured to perform the methods according to the first aspect or any possible implementation of the first aspect.

According to a sixth aspect, an embodiment of this application provides a base station, where the base station includes an RRU or a BBU, and the RRU or the BBU is configured to perform the methods according to the first aspect or any possible implementation of the first aspect.

According to a seventh aspect, an embodiment of this application provides a computer storage medium, where the storage medium stores a program instruction. When read and executed by one or more processors, the program instruction may implement the methods according to the first aspect.

According to an eighth aspect, an embodiment of this application provides a computer program product including an instruction. When run on a computer, the computer program product enables the computer to perform the methods according to the first aspect.

According to a ninth aspect, an embodiment of this application provides a system, where the system includes the power adjustment apparatus according to the second aspect.

DESCRIPTION OF EMBODIMENTS

The following describes technical solutions of this application with reference to accompanying drawings.

The technical solutions of the embodiments of this application may be applied to various communications systems, such as: a global system for mobile communications (GSM), a code division multiple access (CDMA) system, a wideband code division multiple access (WCDMA) system, a general packet radio service (GPRS), a long term evolution (LTE) system, an LTE frequency division duplex (FDD) system, an LTE time division duplex (TDD) system, a universal mobile telecommunications system (UMTS), a worldwide interoperability for microwave access (WiMAX) communications system, a future 5th generation (5G) system, or a new radio (NR) system.

It should be understood that, in the embodiments of this application, only microwave communication is used as an example to describe the technical solutions provided in the embodiments of this application. However, this application is not limited thereto. The technical solutions in the embodiments of this application may be applied to various wireless communications systems.

Figure 1:
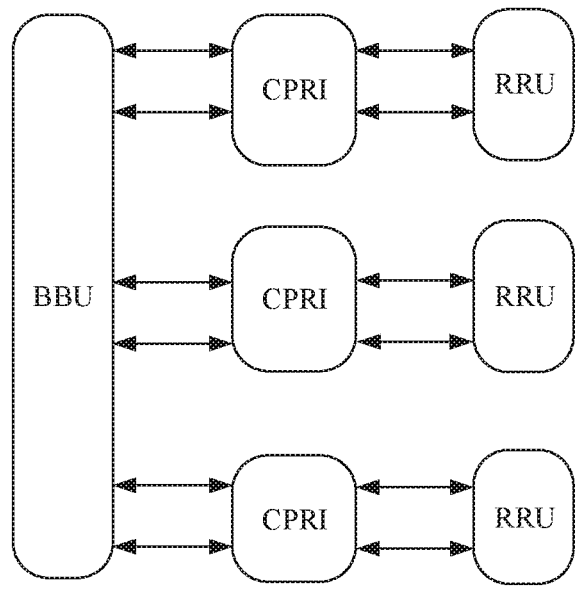
FIG. 1 is a schematic diagram of a network architecture according to an embodiment of this application.

FIG. 1 is a schematic diagram of a network architecture to which a base station in an embodiment of this application can be applied. As shown in FIG. 1, the base station may include a BBU and an RRU. Baseband data is transmitted between the BBU and the RRU by using a CPRI. The BBU is usually deployed in an equipment room in a centralized manner, the RRU is deployed at a far end, and one BBU may be connected to a plurality of RRUs. The BBU mainly completes functions such as baseband processing of a signal (for example, channel coding and decoding, modulation and demodulation), providing transmission management and interfaces, managing wireless resources, and providing clock signals. The RRU mainly completes functions such as intermediate frequency processing (for example, digital I/Q modulation and demodulation, up-down conversion, DA/AD conversion), radio frequency processing, and duplex that are of a signal.

The base station (BS) described in the embodiments of this application is a device that is deployed in a radio access network and that can wirelessly communicate with a terminal. The base station may be in a plurality of forms, such as a macro base station, a micro base station, a relay node, and an access point. For example, the base station in the embodiments of this application may be a base station in a 5G system or a base station in an LTE system. The base station in the 5G system may also be referred to as a transmission reception point (TRP) or a next generation nodeB (gNB).

When an EWF technology is combined with a DPD algorithm, IMD3 spectrum performance and EVM performance of an I/Q signal deteriorate. If the IMD3 spectrum performance deteriorates, a microwave transmission distance decreases; and if the EVM performance of the I/Q signal deteriorates, microwave transmission cannot support a higher modulation method.

In view of this, an embodiment of this application provides a technical solution, so that power adjustment can be automatically performed based on a real-time change of traffic, thereby improving the IMD3 spectrum performance and the EVM performance of the I/Q signal.

It should be understood that a name of the EWF technology is not limited in this embodiment of this application. In other words, the EWF technology may also be represented by another name, for example, a high efficient CPRI bearer technology.

Figure 2:
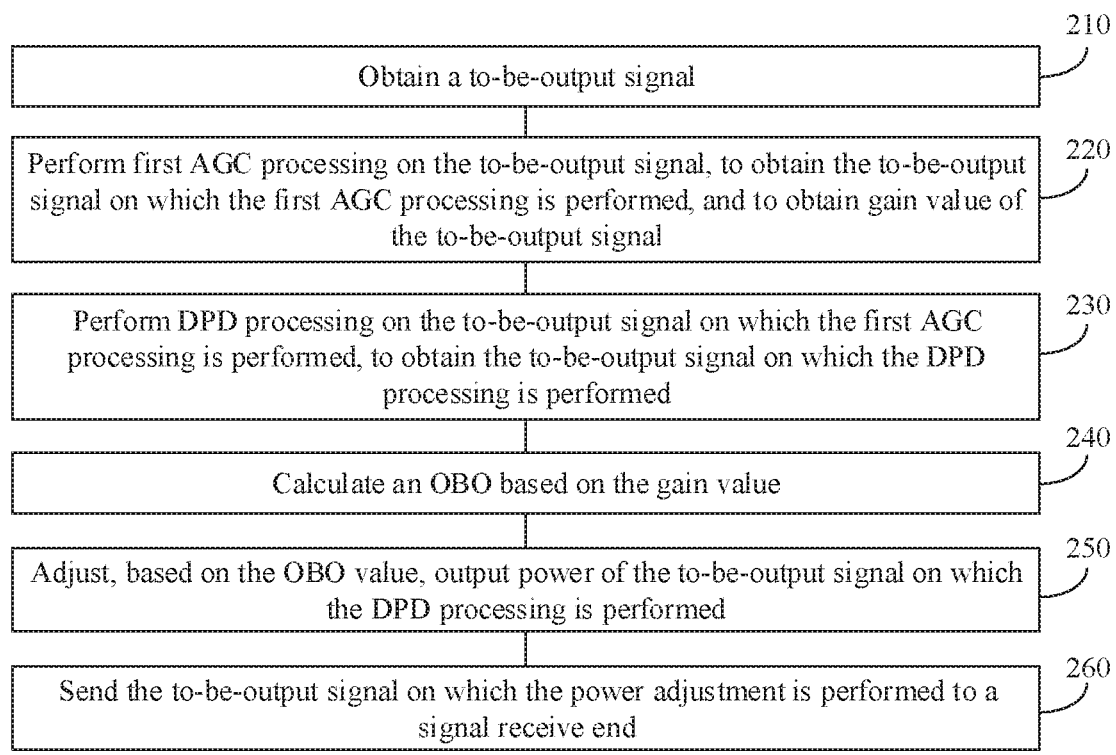
FIG. 2 is a schematic flowchart of a power adjustment method according to an embodiment of this application.

FIG. 2 is a schematic flowchart of a power adjustment method according to an embodiment of this application. The method in FIG. 2 may be performed by a signal transmit end. Optionally, the signal transmit end may be a BBU or may be an RRU. This is not limited in this application.

The method in FIG. 2 may include 210 to 260. The following separately describes 210 to 260 in detail.

In 210, a to-be-output signal is obtained.

A DPD algorithm may include a far end DPD algorithm and a near end DPD algorithm. For example, a structural diagram of a combination of the EWF technology and the far end DPD algorithm according to an embodiment of this application may be shown in FIG. 3, and a structural diagram of a combination of the EWF technology and the near end DPD algorithm may be shown in FIG. 4.

Figure 3:
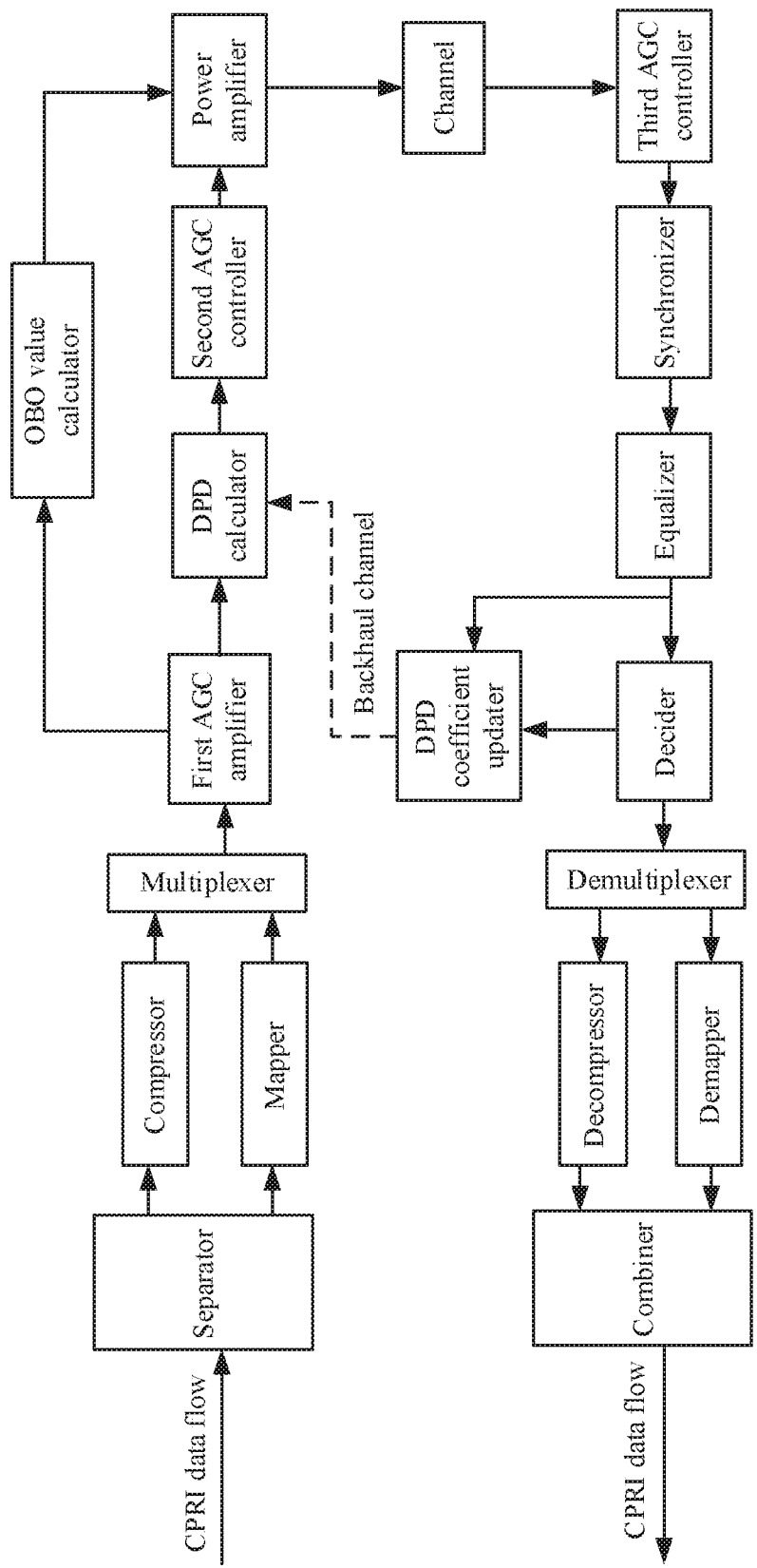
FIG. 3 is a structural diagram of a combination of an EWF technology and a far end DPD algorithm according to an embodiment of this application.
Figure 4:
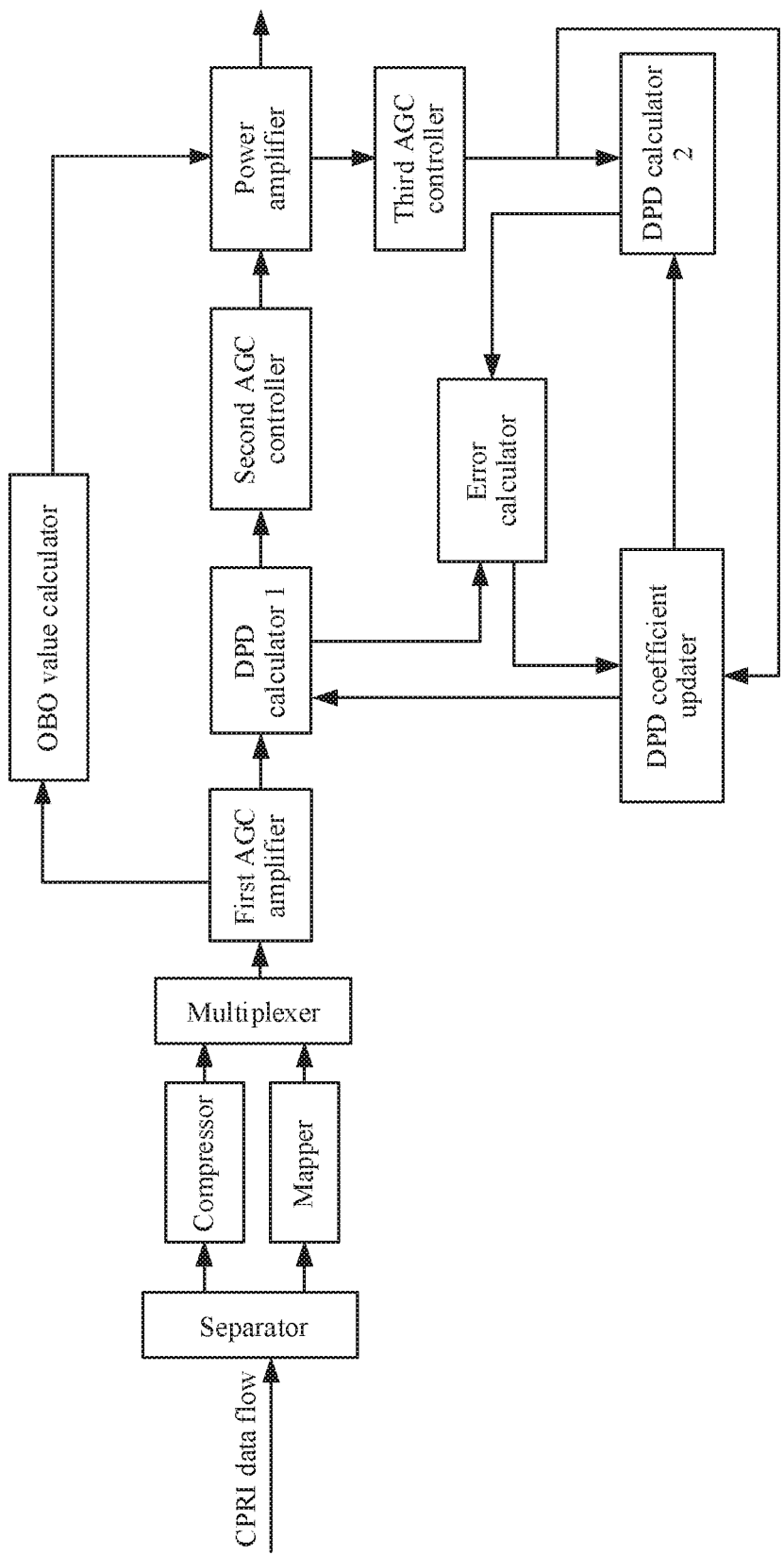
FIG. 4 is a structural diagram of a combination of an EWF technology and a near end DPD algorithm according to an embodiment of this application.

Referring to FIG. 3 and FIG. 4, a signal transmit end may input a CPRI data flow into a separator, where the CPRI data flow may include an I/Q signal and a CW signal. In the separator, the signal transmit end may separate the I/Q signal and the CW signal that are in the input CPRI data flow.

Optionally, the signal transmit end may separate the I/Q signal and the CW signal that are in the CPRI data flow based on different frequencies of the I/Q signal and the CW signal by using a frequency division multiplexing technology.

The separated I/Q signal may enter a compressor, and the signal transmit end may perform, in the compressor, compression and filtering on the separated I/Q signal, to obtain a compressed signal. The separated CW signal may enter a mapper, and the signal transmit end may perform, in the mapper, encoding and mapping on the separated CW signal, to obtain a mapped signal.

For example, a mapping method may include binary phase shift keying (BPSK), quadrature phase shift keying (QPSK), 16 quadrature amplitude modulation (QAM), 64QAM, 256QAM, 1024QAM, or the like. The mapping method may also be referred to as a mapping mechanism or another name. This is not limited in this application.

The signal transmit end may input the compressed signal and the mapped signal into a multiplexer. After possible multiplexing processing is performed in the multiplexer, the compressed signal and the mapped signal may be combined to obtain a to-be-output signal.

It should be understood that, in this embodiment of this application, the multiplexing processing may comply with one of the following principles: time division multiplexing (TDM), frequency division multiplexing (FDM), code division multiplexing (CDM), or wavelength division multiplexing (WDM).

Optionally, the multiplexer may be a time division multiplexer.

Optionally, the multiplexer may be a frequency division multiplexer.

The signal transmit end separates the I/Q signal and the CW signal that are in the CPRI data flow, and combines and transmits the I/Q signal and the CW signal after specific processing, so that a microwave transmission rate can be multiplied.

In 220, first automatic gain control (AGC) processing is performed on the to-be-output signal, to obtain the to-be-output signal on which the first AGC processing is performed, and to obtain gain value of the to-be-output signal.

Still referring to FIG. 3 and FIG. 4, the to-be-output signal enters a first AGC amplifier, and the signal transmit end performs, in the first AGC amplifier, the first AGC processing on the to-be-output signal, to obtain the to-be-output signal on which the first AGC processing is performed, and the gain value of the to-be-output signal is obtained.

There may be a plurality of structures of the first AGC amplifier. This is not specifically limited in this embodiment of this application. Optionally, a structure of the first AGC amplifier may be shown in FIG. 5. It should be understood that FIG. 5 is only an example and does not construe a limitation on the embodiments of this application.

Figure 5:
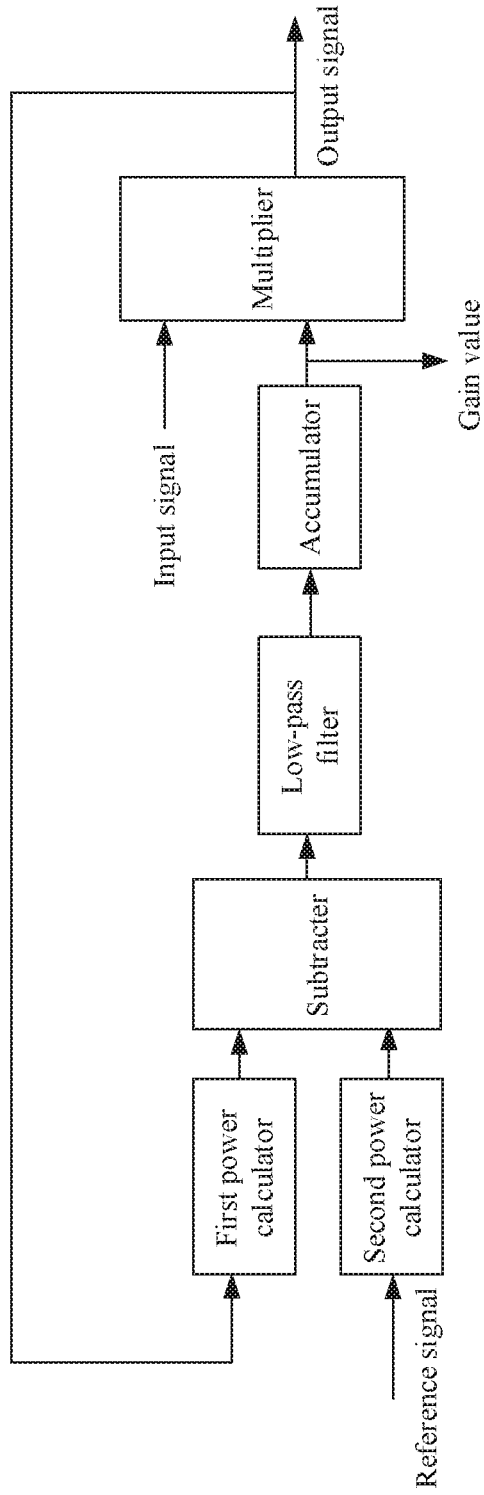
FIG. 5 is a structural diagram of a first AGC amplifier according to an embodiment of this application.

In FIG. 5, an input signal is a to-be-output signal, an output signal is the to-be-output signal on which first AGC processing is performed, and a reference signal may be 1.

Specifically, the to-be-output signal on which the first AGC processing is performed may be obtained by multiplying the to-be-output signal by the gain value. The to-be-output signal on which the first AGC processing is performed may be fed back to a first power calculator. In the first power calculator, a signal transmit end performs power calculation on the to-be-output signal on which the first AGC processing is performed. The reference signal may enter a second power calculator. In the second power calculator, the signal transmit end performs the power calculation on the reference signal. An output signal of the first power calculator and an output signal of the second power calculator may be subtracted in a subtracter, a signal obtained through subtraction may enter a low-pass filter, and a signal whose frequency is lower than a cut-off frequency may pass the low-pass filter, and a signal whose frequency is higher than the cut-off frequency may not pass the low-pass filter.

There may be a plurality of low-pass filters. This is not specifically limited in this embodiment of this application. For example, the low-pass filter may include one of the following: a Butterworth filter or a Chebyshev filter.

The signal that passes the low-pass filter may enter an accumulator, and the gain value of the to-be-output signal may be obtained after possible processing is performed in the accumulator.

Specifically, when the to-be-output signal is relatively weak, the first AGC processing may work corresponding to a linear amplification circuit, so that an output amplitude of the to-be-output signal on which the first AGC processing is performed is increased. When the to-be-output signal reaches a specific strength, the first AGC processing may work corresponding to a compression amplification circuit, so that the output amplitude of the to-be-output signal on which the first AGC processing is performed is decreased.

In this embodiment of this application, the first AGC processing may adjust an energy fluctuation caused by partial CPRI I/Q traffic.

In 230, DPD processing is performed on the to-be-output signal on which the first AGC processing is performed, to obtain the to-be-output signal on which the DPD processing is performed.

In this embodiment of this application, the DPD processing may include DPD calculation and DPD coefficient update. The DPD calculation may be implemented in a DPD calculator, and the DPD calculator may be located in front of a power amplifier and concatenated with the power amplifier. The DPD coefficient update may be implemented in a DPD coefficient updater, and the DPD coefficient updater may be located at the signal transmit end or a signal receive end.

In an implementation, for the far end DPD algorithm, refer to FIG. 3. The signal transmit end may send a signal on which the power adjustment is performed to the signal receive end by using a transmission channel. After receiving the signal, the signal receive end may perform, in a third AGC controller, third AGC processing on the signal. The signal receive end may perform synchronization and equalization processing on the signal on which the third AGC processing is performed, to obtain an equalized signal. The equalized signal may be input into a decider. In the decider, the signal receive end may determine, based on a constellation diagram, a quadrant to which the equalized signal belongs, to obtain an expected signal. The expected signal and the equalized signal enter the DPD coefficient updater, and the signal receive end may adaptively update a DPD coefficient in the DPD coefficient updater.

Optionally, the signal receive end may use a least mean square (LMS) algorithm to adaptively update the DPD coefficient.

Optionally, the signal receive end may use a recursive least square (RLS) algorithm to adaptively update the DPD coefficient.

Optionally, the signal receive end may adaptively update the DPD coefficient by using various possible variants and optimization algorithms that are of the LMS and the RLS. This is not limited in this application.

After updating the DPD coefficient in the DPD coefficient updater, the signal receive end may transmit the updated coefficient to the signal transmit end through a backhaul channel. After receiving the updated coefficient transmitted by the signal receive end, the signal transmit end may perform, in the DPD calculator based on the updated coefficient, pre-distortion processing on the to-be-output signal on which the first AGC processing is performed.

In an implementation, for the near end DPD algorithm, refer to FIG. 4. A signal on which the power adjustment is performed may enter a third AGC controller. The signal transmit end may perform, in the third AGC controller, third AGC processing on the signal on which the power adjustment is performed, and the signal on which the third AGC processing is performed may enter the DPD coefficient updater and a DPD calculator 2. Output of a DPD calculator 1 and output of the DPD calculator 2 may enter an error calculator. The signal transmit end may calculate, in the error calculator, an error signal based on the output of the DPD calculator 1 and the output of the DPD calculator 2. The error signal and the signal on which the third AGC processing is performed may enter the DPD coefficient updater, and the signal transmit end may adaptively update, in the DPD coefficient updater, the DPD coefficient base on the error signal and the signal on which the third AGC processing is performed.

For example, the signal transmit end may adaptively update the DPD coefficient by using the LMS algorithm or the RLS algorithm, or may adaptively update the DPD coefficient by using various possible variants and optimization algorithms of the LMS and the RLS. This is not limited in this application.

After the DPD coefficient is updated, the signal transmit end may send the updated coefficient to the DPD calculator 2 and the DPD calculator 1, and perform the DPD processing in the DPD calculator 2 and the DPD calculator 1 based on the updated coefficient.

It should be understood that in this embodiment of this application, a location relationship between modules in the structural diagrams represents a logical relationship. In addition to the modules shown in the figure, there may be another module between the modules. For example, a module such as a raised cosine roll-off filter may further exist between the first AGC amplifier and the DPD calculator.

It should be further understood that a structure of the third AGC controller may be the same as or different from a structure of the first AGC amplifier. This is not limited in this application.

Optionally, the to-be-output signal on which the DPD processing is performed may enter a second AGC controller, and the signal transmit end performs, in the second AGC controller, second AGC processing on the to-be-output signal on which the DPD processing is performed.

Specifically, when the to-be-output signal on which the DPD processing is performed is relatively weak, the second AGC processing may work corresponding to a linear amplification circuit, so that an output amplitude of the to-be-output signal on which the second AGC processing is performed is increased. When the to-be-output signal on which the DPD processing is performed reaches a specific strength, the second AGC processing may work corresponding to a compression amplification circuit, so that the output amplitude of the to-be-output signal on which the second AGC processing is performed is decreased.

It should be understood that the implementation of the second AGC processing corresponds to the implementation of the first AGC processing. For details, refer to the description about the first AGC processing. Details are not described herein again.

In this embodiment of this application, there may be a plurality of structures of the second AGC controller, and the structures of the second AGC controller may be the same as or different from the structures of the first AGC amplifier and the third AGC controller. This is not limited in this application.

For example, a structure of the second AGC controller may be a structure shown in FIG. 5.

Unsatisfied CPRI traffic may cause energy fluctuation. For example, the CPRI I/Q signal may include some zeros, and these zeros may cause the partial CPRI traffic. In addition, power of the I/Q signal is obtained by calculating power of all symbols in the I/Q signal and calculating an average value. Because zeros in the I/Q signal are also included in calculating the average power, and each time the traffic is not satisfied to a different degree, the energy fluctuation is caused. In this embodiment of this application, the first AGC amplifier may adjust the energy fluctuation caused by the partial traffic, and the second AGC controller may adjust an energy fluctuation output by the DPD calculator. In this way, the energy fluctuation output by the DPD calculator may be decoupled from the energy fluctuation caused by the partial traffic, so that IMD3 spectrum performance may be improved and a microwave transmission distance can be increased.

In 240, an output power back-off (OBO) value is calculated based on the gain value.

The gain value obtained after the signal transmit end performs, in the first AGC amplifier, the first AGC processing on the to-be-output signal may enter an OBO value calculator, and the signal transmit end may calculate the OBO value in the OBO value calculator.

In this embodiment of this application, the OBO value may be in correspondence with the gain value. In other words, a larger gain value indicates a smaller OBO value. Optionally, the correspondence may be represented by a formula (1):

$$C=10*lg(1/G^2) \qquad (1)$$

where C represents the OBO value, and G represents the gain value.

Optionally, a direct proportional relationship between the OBO value and the gain value may also be represented by a formula (2):

$$C=10*lg(1/G^2)+H \qquad (2)$$

where H represents a constant. In the foregoing technical solution, the gain value is in a one-to-one correspondence with the traffic. In other words, lower traffic indicates a larger gain value. The OBO value is calculated based on the gain value, so that the OBO value may also be in correspondence with the traffic. In other words, lower traffic indicates a smaller OBO value.

In 250, the output power of the to-be-output signal on which the DPD processing is performed is adjusted based on the OBO value.

The OBO value obtained through calculation in the OBO value calculator enters the power amplifier, and the signal transmit end may adjust, based on the input OBO value, the output power of the to-be-output signal on which the DPD processing is performed.

In an implementation, the signal transmit end may adjust, based on the OBO value and a preset amplification factor, the output power of the to-be-output signal on which the DPD processing is performed.

In an example, the signal transmit end may adjust the output power to a first value, where the first value is obtained by subtracting the OBO value from a product of the output power and the preset amplification factor.

Optionally, the signal transmit end may adjust the output power to the first value if the product of the output power and the preset amplification factor is greater than a first threshold a.

In this embodiment of this application, a may be set to maximum power used when the to-be-output signal on which the DPD processing is performed is sent at lowest traffic.

Optionally, the minimum traffic may be represented as a case in which the CPRI I/Q signal traffic is zero. To be specific, in this case, the CPRI data flow includes only the CW signal. Certainly, the minimum traffic does not exclude a case in which the CPRI I/Q signal traffic has a very small value. For example, the CPRI I/Q signal traffic may occupy 0.01% of the CPRI data flow or may occupy 0.2%, 0.5%, or the like of the CPRI data flow. This is not limited in this application.

Optionally, the signal transmit end may obtain a value of a through testing.

For example, the signal transmit end may obtain the value of a by testing a working curve of the power amplifier when the CPRI I/Q signal traffic is zero.

Optionally, the signal transmit end may obtain the value of a through calculation.

For example, the signal transmit end may obtain the value of a through estimation according to some possible methods.

It should be understood that the specific examples in the embodiments of this application are merely intended to help a person skilled in the art better understand the embodiments of this application, rather than limit the scope of the embodiments of this application.

Optionally, the signal transmit end may amplify the output power based on the preset amplification factor, and then adjust the amplified output power based on the OBO value.

Optionally, the signal transmit end may compare the amplified output power with the value of a. If the amplified output power is greater than a, the signal transmit end may perform back-off on the amplified output power based on the OBO value.

If the amplified output power is less than or equal to a, the signal transmit end may not adjust the amplified output power.

For example, the output power is set to P, the preset amplification factor is set to N, and the OBO value is set to C. The signal transmit end amplifies the output power by N times, to obtain the amplified output power N*P. If N*P>a, back-off is performed on N*P based on a value of C; or if N*P≤a, N*P remains unchanged.

Optionally, the signal transmit end may directly adjust the output power based on the OBO value and the preset amplification factor.

If the product of the output power and the preset amplification factor is less than or equal to a, the signal transmit end may adjust the output power to the product of the output power and the preset amplification factor.

For example, the output power is set to P, the preset amplification factor is set to N, and the OBO value is set to C. If N*P>a, the signal transmit end may adjust the output power to N*P−C; or if N*P≤a, the signal transmit end may adjust the output power to N*P.

In an implementation, the signal transmit end may adjust, based on the OBO value, the preset amplification factor, and an adjustment amount that is fed back by the signal receive end, the output power of the to-be-output signal on which the DPD processing is performed.

It should be understood that various implementations of the embodiments of this application may be separately implemented or jointly implemented. This is not limited in the embodiments of this application.

For example, in this embodiment of this application, the implementation in which the signal transmit end may adjust the output power based on the OBO value and the preset amplification factor and the implementation in which the signal transmit end may adjust the output power based on the OBO value, the preset amplification factor, and the adjustment amount that is fed back by the signal receive end may be separately implemented, or may be implemented in combination. The following separately describes the implementation in which the signal transmit end may adjust the output power based on the OBO value, the preset amplification factor, and the adjustment amount that is fed back by the signal receive end. It should be understood that, in addition to the following description, for the following embodiments, reference may further be made to related descriptions in the foregoing embodiments. For brevity, details are not described in the following.

Figure 6:
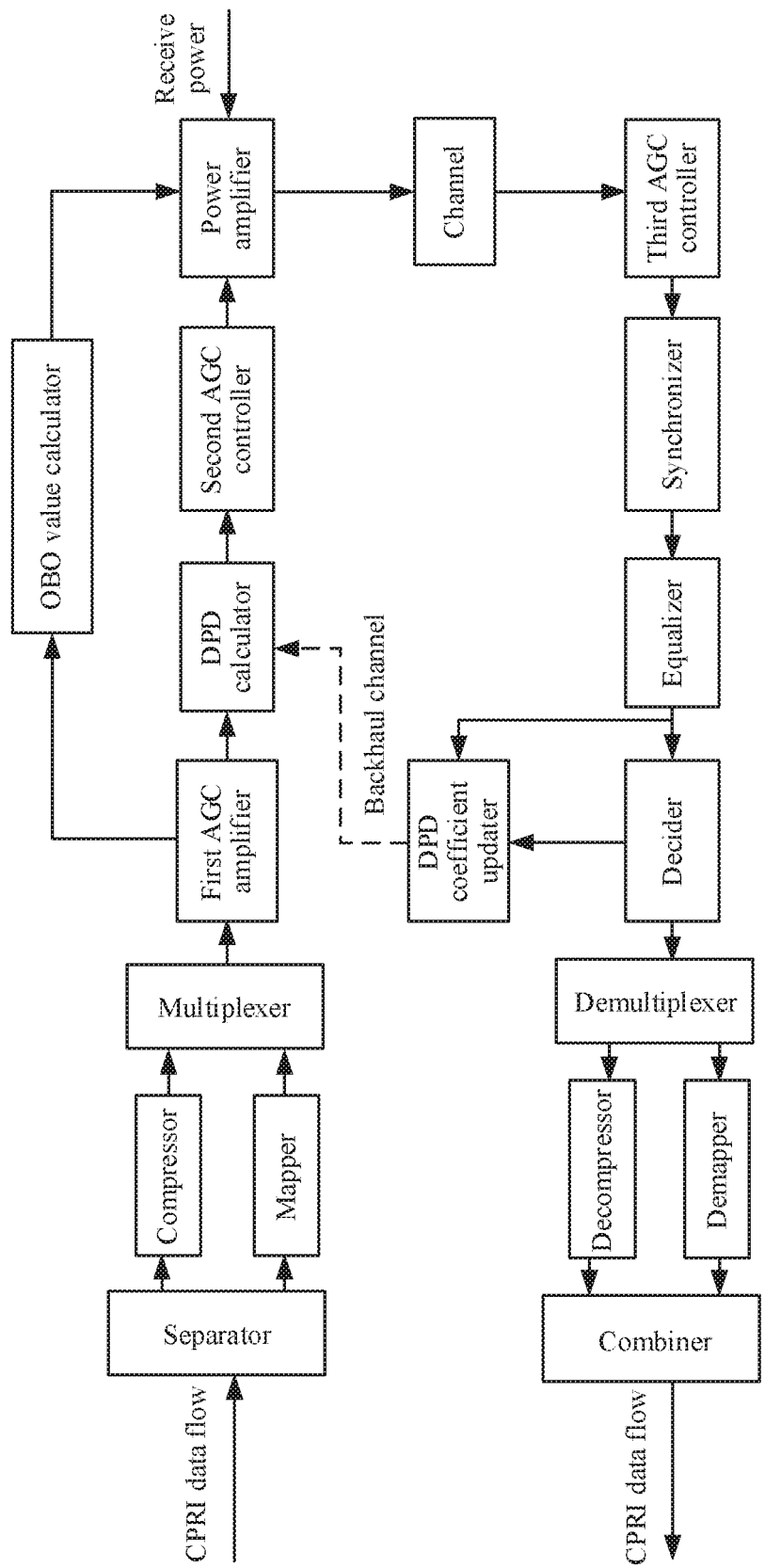
FIG. 6 is a structural diagram of a combination of an EWF technology and a far end DPD algorithm according to another embodiment of this application.

FIG. 6 is a structural diagram of a combination of an EWF technology and a far end DPD algorithm according to another embodiment of this application. As shown in FIG. 6, a signal receive end may feed back receive power to a transmit end.

In an example, the signal transmit end may adjust output power to a second value, where the second value is obtained by subtracting an OBO value from a third value, and the third value is obtained by adding an adjustment amount to a product of the output power before adjustment and a preset amplification factor.

Optionally, the signal transmit end may adjust the output power to the second value if the third value is greater than a.

Optionally, the signal transmit end may amplify the output power based on the preset amplification factor, and then adjust the amplified output power based on the OBO value and the adjustment amount.

Optionally, when the receive power fed back by the signal receive end is relatively small and fades to a threshold, and if a sum of the amplified output power and the adjustment amount is greater than a, the signal transmit end may increase the amplified output power by using a difference between the adjustment amount and the OBO value.

If the sum of the amplified output power and the adjustment amount is less than or equal to a, the signal transmit end may increase the amplified output power by using the adjustment amount.

It should be understood that, in this case, the adjustment amount is a positive value, indicating that the amplified output power needs to be increased.

For example, the output power may be set to P, the preset amplification factor may be set to N, the adjustment amount may be set to X, and the OBO value may be set to C. The signal transmit end amplifies the output power by N times to obtain the amplified output power N*P. If the signal transmit end increases the amplified output power by X, and the amplified output power is still greater than a, that is, 10*lg(N*P)+X>a, the signal transmit end may increase the amplified output power based on a value of X−C.

If the signal transmit end increases the amplified output power by X, and the amplified output power is less than or equal to a, that is, 10*lg(N*P)+X≤a, the signal transmit end may increase the amplified output power based on a value of X.

Optionally, when the receive power fed back by the signal receive end is relatively large and exceeds a threshold, and if the sum of the amplified output power and the adjustment amount is greater than a, the signal transmit end may perform back-off on the amplified output power by using the difference between the preset adjustment amount and the OBO value.

If the sum of the amplified output power and the adjustment amount is less than or equal to a, the signal transmit end may perform back-off on the amplified output power by using the adjustment amount.

It should be understood that, in this case, the adjustment amount is a negative value, indicating that back-off needs to be performed on the amplified output power.

For example, the output power may be set to P, the preset amplification factor may be set to N, the adjustment amount may be set to Y, and the OBO value may be set to C. The signal transmit end first amplifies the output power by N times, and the amplified output power is N*P. If the signal transmit end rolls back the amplified output power by Y, and the amplified output power is still greater than a, that is, 10*lg(N*P)+Y>a, the signal transmit end may perform back-off on the amplified output power based on a value of Y−C.

If the signal transmit end rolls back the amplified output power by Y, and the amplified output power is less than or equal to a, that is, 10*lg(N*P)+Y≤a, the signal transmit end may perform back-off on the amplified output power base on a value of Y.

Optionally, the signal transmit end may directly adjust the output power based on the OBO value, the preset amplification factor, and the adjustment amount that is fed back by the signal receive end to the transmit end. Optionally, when the receive power fed back by the signal receive end is relatively small and fades to a threshold, and if a value obtained by adding the adjustment amount to the product of the output power and the preset amplification factor is greater than a, the signal transmit end may adjust the output power to a difference between the value and the OBO value.

If the value obtained by adding the adjustment amount to the product of the output power and the preset amplification factor is less than or equal to a, the signal transmit end may adjust the output power to the value.

It should be understood that, in this case, the adjustment amount is a positive value, indicating that the output power needs to be increased.

For example, the output power may be set to P, the preset amplification factor may be set to N, the adjustment amount may be set to X, and the OBO value may be set to C. If 10*lg(N*P)+X>a, the signal transmit end may adjust the output power to a value of 10*lg(N*P)+X−C.

If 10*lg(N*P)+X≤a, the signal transmit end may adjust the output power to a value of 10*lg(N*P)+X.

Optionally, when the receive power fed back by the signal receive end is relatively large and exceeds a threshold, and if a value obtained by adding the adjustment amount to the product of the output power and the preset amplification factor is greater than a, the signal transmit end may adjust the output power to the difference between the value and the OBO value.

If the value obtained by adding the adjustment amount to the product of the output power and the preset amplification factor is less than or equal to a, the signal transmit end may adjust the output power to the value.

It should be understood that, in this case, the adjustment amount is a negative value, indicating that back-off needs to be performed on the amplified output power.

For example, the output power may be set to P, the preset amplification factor may be set to N, the adjustment amount may be set to Y, and the OBO value may be set to C. If 10*lg(N*P)+Y>a, the signal transmit end may adjust the output power to a value of 10*lg(N*P)+Y−C.

If 10*lg(N*P)+Y≤a, the signal transmit end may adjust the output power to a value of 10*lg(N*P)+Y.

It should be understood that, in this embodiment of this application, the adjustment amount that is fed back by the signal receive end corresponds to the receive power sent by the signal receive end to the transmit end. In other words, specific receive power corresponds to a specific adjustment amount.

In this embodiment of this application, when the EWF technology is combined with the near end DPD algorithm, the specific implementation in which the signal transmit end adjusts, based on the OBO value, the preset amplification factor, and the adjustment amount, the output power of the to-be-output signal on which the DPD processing is performed corresponds to the implementation in which the EWF technology is combined with the far end DPD algorithm. For details, refer to the descriptions in FIG. 6. Details are not described herein again.

In 260, the to-be-output signal on which the power adjustment is performed is sent to the signal receive end.

As shown in FIG. 3 and FIG. 6, when the EWF technology is combined with the far end DPD algorithm, the signal transmit end may send, to the signal receive end, the to-be-output signal on which the power adjustment is performed.

As shown in FIG. 4, when the EWF technology is combined with the near end DPD algorithm, the signal transmit end may send, to the signal receive end and the third AGC controller, to-be-output signals on which the power adjustment is performed.

It should be understood that amplitudes of the to-be-output signals received by the signal receive end and the third AGC controller may be the same or may be different. This is not limited in this application.

It should be understood that, in the embodiments of this application, "first", "second", and "third" are merely used for distinguishing between different objects, but do not constitute a limitation on the scope of the embodiments of this application.

In this embodiment of this application, the signal transmit end may automatically adjust the output power of the to-be-output signal based on a real-time change of the traffic, to reduce the non-linearity of the power amplifier, thereby improving the IMD3 spectrum performance and the EVM performance of the I/Q signal.

Table 1 and Table 2 respectively show improvement amounts of the IMD3 spectrum performance and the EVM performance of the I/Q signal after the technical solution in the embodiments of this application is compared with other existing technical solutions. Table 1 shows the improvement amounts of the IMD3 spectrum performance and the EVM performance of the I/Q signal after the technical solution in this embodiment of this application is used when the CPRI I/Q traffic is 10%. Table 2 shows the improvement amounts of the IMD3 spectrum performance and the EVM performance of the I/Q signal after the technical solution in this embodiment of this application is used when the CPRI I/Q traffic is 20%.

It should be understood that the EVM performance corresponds to a minimum square error (MSE) in Table 1 and Table 2. QAM transmission in the table refers to transmission of the CPRI signal in a digital 256 QAM manner.

TABLE 1

| CPRI I/Q traffic | Output power (dBm) | OBO Value (dB) | IMD3 in this application increases (dB) compared with QAM transmission | MSE in this application increases (dB) compared with QAM transmission | MSE net increase (dB) |
| --- | --- | --- | --- | --- | --- |
| 10% | 17 | 5 | 6 | 6.2 | 1.2 |
|  | 16 | 5 | 5.3 | 5.7 | 0.7 |
|  | 15 | 5 | 4 | 5.1 | 0.1 |
|  | 14 | 5 | 4 | 5.0 | 0 |
|  | 13 | 5 | 5 | 5.0 | 0 |

TABLE 2

| CPRI I/Q traffic | Output power (dBm) | OBO Value (dB) | IMD3 in this application increases (dB) compared with QAM transmission | MSE in this application increases (dB) compared with QAM transmission | MSE net increase (dB) |
| --- | --- | --- | --- | --- | --- |
| 20% | 17 | 4.3 | 6.2 | 4.9 | 0.6 |
|  | 16 | 4.3 | 7 | 4.8 | 0.5 |
|  | 15 | 4.3 | 5 | 4.5 | 0.2 |
|  | 14 | 4.3 | 5 | 4.4 | 0.1 |
|  | 13 | 4.3 | 5 | 4.3 | 0 |

It can be learned from Table 1 that, when the CPRI I/Q traffic is 10%, the OBO value is 5 dB regardless of the output power. It can be learned from Table 2 that, when the CPRI I/Q traffic is 20%, the OBO value is 4.3 dB regardless of the output power. Therefore, it can be learned that the OBO value depends on the CPRI I/Q traffic and is irrelevant to the output power.

It can be learned from Table 1 and Table 2 that, after the signal transmit end uses the technical solution in the embodiments of this application, the MSE performance corresponding to the 10% CPRI I/Q traffic and the MSE performance corresponding to the 20% CPRI I/Q traffic are improved compared with those in another existing technical solution. In a case in which the output power is relatively large, the MSE performance of the 10% CPRI I/Q traffic can be increased by 1 dB. For example, when the output power is 17 dBm, the MSE performance of the 10% CPRI I/Q traffic may be increased by 1.2 dB.

It can be further learned from Table 1 and Table 2 that, after the signal transmit end uses the technical solution in the embodiments of this application, the IMD3 spectrum performance corresponding to the 10% CPRI I/Q traffic and the IMD3 spectrum performance corresponding to the 20% CPRI I/Q traffic are significantly improved. The larger output power of the to-be-output signal indicates a more significant improvement of the IMD3 spectrum performance. When the CPRI I/Q traffic is 10%, the IMD3 spectrum performance may be increased by at least 4 dB. When the CPRI I/Q traffic is 20%, the IMD3 spectrum performance may be increased by at least 5 dB.

The foregoing describes in detail the method provided in the embodiments of this application. To implement the functions in the methods provided in the embodiments of this application, the signal transmit end may include a hardware structure and/or a software module, and implement the functions in a form of the hardware structure, the software module, or a combination of the hardware structure and the software module. Whether a function in the foregoing functions is performed by using the hardware structure, the software module, or the combination of the hardware structure and the software module depends on a specific application and a design constraint condition of the technical solutions.

Figure 7:
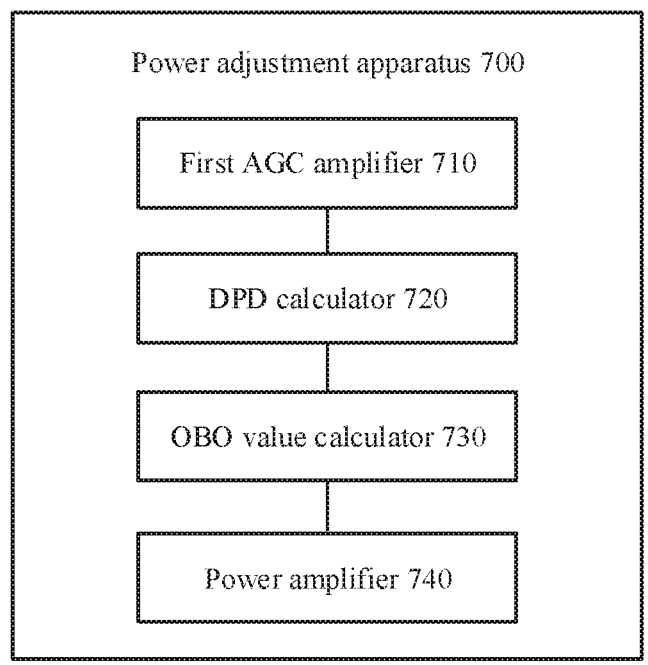
FIG. 7 is a schematic block diagram of a power adjustment apparatus according to an embodiment of this application.

Based on the same inventive concept as the foregoing method embodiment, an embodiment of this application provides a power adjustment apparatus, configured to implement functions of the signal transmit end in the foregoing method. FIG. 7 is a schematic block diagram of an apparatus according to an embodiment of this application. It should be understood that the power adjustment apparatus 700 shown in FIG. 7 is merely an example, and the power adjustment apparatus element in the embodiment of this application may further include another module or unit or include modules having functions similar to those of modules in FIG. 7, or does not need to include all modules in FIG. 7.

A first AGC amplifier 710 is configured to obtain a to-be-output signal, and perform first AGC processing on the to-be-output signal to obtain the to-be-output signal on which the first AGC processing is performed, and to obtain a gain value of the to-be-output signal.

A DPD calculator 720 is configured to perform DPD processing on the to-be-output signal that passes the first AGC amplifier 710, to obtain the to-be-output signal on which the DPD processing is performed.

An OBO value calculator 730 is configured to calculate an OBO value based on the gain value obtained by the first AGC amplifier 710.

The power amplifier 740 is configured to adjust, based on the OBO value obtained by the OBO value calculator 730, output power of the to-be-output signal that passes the DPD calculator 720; and send, to a signal receive end, the to-be-output signal on which the power adjustment is performed.

Optionally, the power adjustment apparatus 700 may further include a second AGC controller 750, configured to perform second AGC processing on the to-be-output signal that passes the DPD calculator 720.

Optionally, the power amplifier 740 may further be configured to adjust, based on the OBO value obtained by the OBO value calculator 730 and a preset amplification factor, the output power of the to-be-output signal that passes the DPD calculator 720.

Optionally, the power amplifier 740 may further be configured to adjust the output power to a first value, where the first value is obtained by subtracting the OBO value from a product of the output power and the preset amplification factor.

Optionally, the power amplifier 740 may further be configured to adjust the output power to the first value if the product of the output power and the preset amplification factor is greater than a first threshold.

Optionally, the power amplifier 740 may further be configured to adjust, based on the OBO value, the preset amplification factor, and an adjustment amount that is fed back by the signal receive end, the output power of the to-be-output signal that passes the DPD calculator 720.

Optionally, the power amplifier 740 may further be configured to adjust the output power to a second value, where the second value is obtained by subtracting the OBO value from a third value, and the third value is obtained by adding the adjustment amount to a product of the output power before adjustment and the preset amplification factor.

Optionally, the power amplifier 740 may further be configured to adjust the output power to the second value if the third value is greater than a first threshold.

Optionally, the OBO value calculator 730 may further be configured to calculate the OBO value based on formula (1).

The first threshold is maximum power used when the to-be-output signal on which the DPD processing is performed is sent at lowest traffic.

Optionally, the power adjustment apparatus 700 may further include:

a separator 760, configured to obtain a CPRI data flow, where the CPRI data flow includes an I/Q signal and a CW signal; and separate the I/Q signal and the CW signal that are in the CPRI data flow;

a mapper 770, configured to encode and map the CW signal that passes the separator 760, to obtain a mapped signal:

a compressor 780, configured to perform compression and filtering on the I/Q signal that passes the separator 760; and a multiplexer 790, configured to combine the mapped signal that passes the mapper 770 with the I/Q signal that passes the compressor 780, to obtain the to-be-output signal.

It should be understood that the power adjustment apparatus 700 may perform actions of the signal transmit end in the methods provided in the embodiments of this application. To avoid repetition, detailed descriptions thereof are omitted herein.

Figure 8:
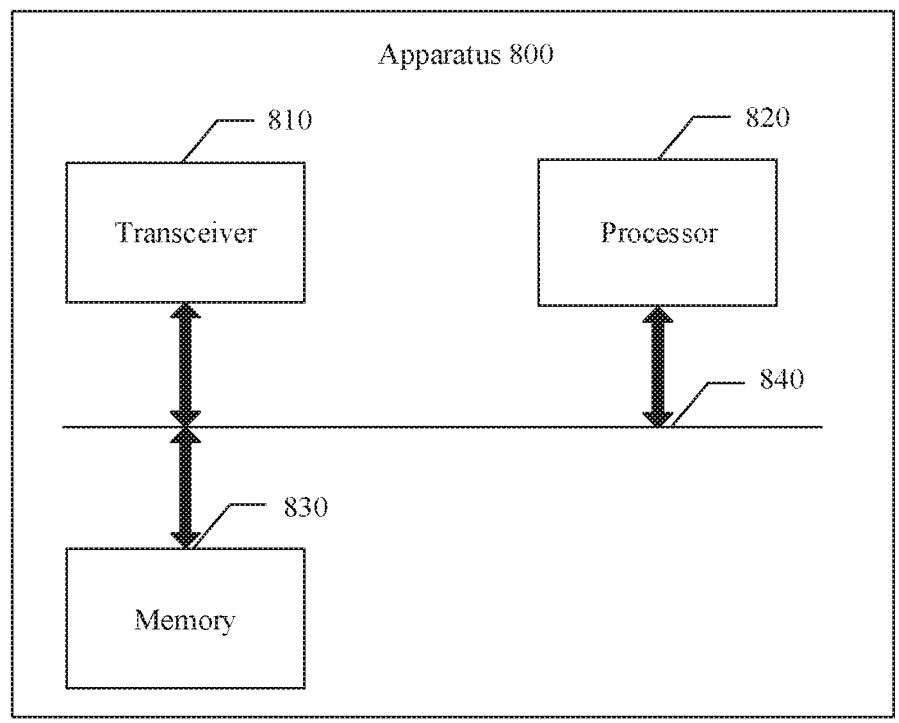
FIG. 8 is a schematic block diagram of a power adjustment apparatus according to an embodiment of this application.

FIG. 8 shows a power adjustment apparatus 800 according to an embodiment of this application. The power adjustment apparatus 800 is configured to implement functions of a signal transmit end in the methods provided in the embodiments of this application. The apparatus 800 includes a processor 820, configured to implement the functions of the signal transmit end in the methods provided in the embodiments of this application. For example, the processor 820 may be configured to obtain a to-be-output signal, and perform first AGC processing on the to-be-output signal, to obtain the to-be-output signal on which the first AGC processing is performed, and to obtain a gain value of the to-be-output signal, and the like. For details, refer to detailed descriptions in the method example. Details are not described herein again.

The apparatus 800 may further includes a memory 830, configured to store a program instruction and/or data. The memory 830 is coupled to the processor 820. The coupling in the embodiments of this application is an indirect coupling or a communication connection between apparatuses, units, or modules, may be in an electrical form, a mechanical form, or another form, and is used for information exchange between the apparatuses, the units, or the modules. The processor 820 may operate with the memory 830 together. The processor 820 may execute the program instruction stored in the memory 830.

The processor 820 may be implemented by using hardware or software. When implemented by using the hardware, the processor 820 may be a logic circuit, an integrated circuit, or the like. When implemented by using the software, the processor 820 may be a general-purpose processor and is implemented by reading software code stored in a memory 830. The memory 830 may be integrated in the processor 820, or may individually exist outside the processor 820.

The apparatus 800 may further include a transceiver 810, configured to communicate with another device by using a transmission medium, so that an apparatus in the apparatus 800 may communicate with the another device. The processor 820 may receive and send a signal by using the transceiver 810, and is configured to implement the methods performed by the signal transmit end in the method embodiments of this application.

Optionally, the transceiver 810 may further be referred to as a transceiver unit, a transceiver, a transceiver circuit, or the like.

Optionally, the transceiver 810 may include a control circuit and an antenna. The control circuit may be configured to convert a baseband signal and a radio frequency signal, and process the radio frequency signal. The antenna may be configured to receive and send the radio frequency signal.

In this embodiment of this application, a specific connection medium among the transceiver 810, the processor 820 and the memory 830 is not limited. In this embodiment of this application, in FIG. 8, the memory 830, the processor 820, and the transceiver 810 are connected to each other by using a bus 840. The bus is represented by using a thick line in FIG. 8. A manner of connection between other components is only schematically described, but is not used as a limitation. The bus may be classified into an address bus, a data bus, a control bus, and the like. For ease of representation, only one thick line is used to represent the bus in FIG. 8, but this does not mean that there is only one bus or only one type of bus.

In this embodiment of this application, the processor may be a central processing unit (CPU), a general purpose processor, a network processor (NP), a digital signal processor (DSP), a microprocessor, a microcontroller, a programmable logic device (PLD), or any combination thereof.

In this embodiment of this application, the memory may be a volatile memory, for example, a random-access memory (RAM). The memory may alternatively include a non-volatile memory, for example, a flash memory, a hard disk drive (HDD), or a solid-state drive (, SSD). The memory may alternatively be a combination of the foregoing types of memories. The memory may alternatively be any other medium that can be configured to carry or store expected program code in a form of an instruction or a data structure and that can be accessed by a computer, but is not limited thereto.

It should be understood that sequence numbers of the foregoing processes do not mean execution sequences in the embodiments of the present invention. The execution sequences of the processes should be determined according to functions and internal logic of the processes, and should not be construed as any limitation on the implementation processes of the embodiments of the present invention.

It may be clearly understood by a person skilled in the art that, for the purpose of a convenient and brief description, for a detailed working process of the foregoing system, apparatus, and unit, refer to a corresponding process in the foregoing method embodiments, and details are not described herein again.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of the embodiments.

In addition, functional units in the embodiments of this application may be integrated into one processing unit, or each of the units may exist alone physically, or two or more units are integrated into one unit.

All or some of the foregoing methods in the embodiments of this application may be implemented by means of software, hardware, firmware, or any combination thereof. When software is used to implement the embodiments, the embodiments may be implemented completely or partially in a form of a computer program product. The computer program product includes one or more computer instructions. When the computer program instructions are loaded and executed on the computer, the procedure or functions according to the embodiments of the present invention are all or partially generated. The computer may be a general-purpose computer, a dedicated computer, a computer network, a network device, a user device, or other programmable apparatuses. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a digital video disc (DVD)), a semiconductor medium (for example, an SSD), or the like.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A power adjustment method, comprising:
   obtaining a to-be-output signal;
   performing first automatic gain control (AGC) processing on the to-be-output signal to obtain the to-be-output signal on which the first AGC processing is performed, and to obtain a gain value of the to-be-output signal;
   performing digital pre-distortion (DPD) processing on the to-be-output signal on which the first AGC processing is performed, to obtain the to-be-output signal on which the DPD processing is performed;
   calculating an output power back-off (OBO) value based on the gain value;
   adjusting, based on the OBO value, output power of the to-be-output signal on which the DPD processing is performed; and
   sending, to a signal receive end, the to-be-output signal on which the output power adjustment is performed.

2. The method according to claim 1, wherein after performing DPD processing on the to-be-output signal on which the first AGC processing is performed, the method further comprises:
   performing second AGC processing on the to-be-output signal on which the DPD processing is performed.

3. The method according to claim 1, wherein adjusting, based on the OBO value, the output power of the to-be-output signal on which the DPD processing is performed comprises:
   adjusting, based on the OBO value and a preset amplification factor, the output power of the to-be-output signal on which the DPD processing is performed.

4. The method according to claim 3, wherein adjusting, based on the OBO value and the preset amplification factor, the output power of the to-be-output signal on which the DPD processing is performed comprises:
   adjusting the output power to a first value, wherein the first value is obtained by subtracting the OBO value from a product of the output power and the preset amplification factor.

5. The method according to claim 4, wherein adjusting the output power to the first value comprises:
   adjusting the output power to the first value if the product of the output power and the preset amplification factor is greater than a first threshold.

6. The method according to claim 3, wherein adjusting, based on the OBO value and the preset amplification factor, the output power of the to-be-output signal on which the DPD processing is performed further comprises:
   adjusting, based on the OBO value, the preset amplification factor, and an adjustment amount that is fed back by the signal receive end, the output power of the to-be-output signal on which the DPD processing is performed.

7. The method according to claim 6, wherein adjusting, based on the OBO value, the preset amplification factor, and the adjustment amount that is fed back by the signal receive end, the output power of the to-be-output signal on which the DPD processing is performed comprises:
   adjusting the output power to a second value, wherein the second value is obtained by subtracting the OBO value from a third value, and the third value is obtained by adding the adjustment amount to a product of the output power before adjustment and the preset amplification factor.

8. The method according to claim 7, wherein adjusting the output power to the second value comprises:
   adjusting the output power to the second value if the third value is greater than a first threshold.

9. The method according to claim 5 wherein the first threshold is maximum power used in response to the to-be-output signal on which the DPD processing is performed is sent at lowest traffic.

10. The method according to claim 1, wherein the OBO value is calculated using: $C=10*\lg(1/G^2)$, where C is the OBO value, and G is the gain value.

11. The method according to claim 1, wherein before obtaining the to-be-output signal, the method further comprises:
obtaining a common public radio interface (CPRI) data flow, wherein the CPRI data flow comprises an in-phase and quadrature (I/Q) signal and a control word (CW) signal;
separating the I/Q signal and the CW signal that are in the CPRI data flow to obtain a separated I/Q signal and a separated CW signal;
encoding and mapping the separated CW signal to obtain a mapped signal;
performing compression and filtering on the separated I/Q signal to obtain a compressed and filtered I/Q signal; and
combining the mapped signal with the compressed and filtered I/Q signal to obtain the to-be-output signal.

12. A power adjustment apparatus, comprising:
at least one processor;
a non-transitory computer-readable storage medium coupled to the at least one processor and storing programming instructions for execution by the at least one processor, wherein the programming instructions instruct the at least one processor to cause:
a first automatic gain control (AGC) amplifier to:
obtain a to-be-output signal; and
perform first AGC processing on the to-be-output signal to obtain the to-be-output signal on which the first AGC processing is performed, and to obtain a gain value of the to-be-output signal;
a digital pre-distortion (DPD) calculator to perform DPD processing on the to-be-output signal that passes the first AGC amplifier to obtain the to-be-output signal on which the DPD processing is performed;
an output power back-off (OBO) value calculator to calculate an OBO value based on the gain value obtained by the first AGC amplifier; and
a power amplifier to adjust, based on the OBO value obtained by the OBO value calculator, output power of the to-be-output signal that passes the DPD calculator; and
send, to a signal receive end, the to-be-output signal on which the output power adjustment is performed.

13. The apparatus according to claim 12, wherein the programming instructions further instruct the at least one processor to cause:
a second AGC amplifier to perform second AGC processing on the to-be-output signal that passes the DPD calculator.

14. The apparatus according to claim 12, wherein the programming instructions further instruct the at least one processor to:
adjust, based on the OBO value obtained by the OBO value calculator and a preset amplification factor, the output power of the to-be-output signal that passes the DPD calculator.

15. The apparatus according to claim 14, wherein the programming instructions further instruct the at least one processor to:
adjust the output power to a first value, wherein the first value is obtained by subtracting the OBO value from a product of the output power and the preset amplification factor.

16. The apparatus according to claim 15, wherein the programming instructions further instruct the at least one processor to:
adjust the output power to the first value if the product of the output power and the preset amplification factor is greater than a first threshold.

17. The apparatus according to claim 14, wherein the programming instructions further instruct the at least one processor to:
adjust, based on the OBO value, the preset amplification factor, and an adjustment amount that is fed back by the signal receive end, the output power of the to-be-output signal that passes the DPD calculator.

18. The apparatus according to claim 17, wherein the programming instructions further instruct the at least one processor to:
adjust the output power to a second value, wherein the second value is obtained by subtracting the OBO value from a third value, and the third value is obtained by adding the adjustment amount to a product of the output power before adjustment and the preset amplification factor.

19. The apparatus according to claim 18, wherein the programming instructions further instruct the at least one processor to:
adjust the output power to the second value if the third value is greater than a first threshold.

20. A non-transitory, computer-readable storage medium storing one or more instructions executable by a computer system to perform operations comprising:
obtaining a to-be-output signal;
performing first automatic gain control (AGC) processing on the to-be-output signal to obtain the to-be-output signal on which the first AGC processing is performed, and to obtain a gain value of the to-be-output signal;
performing digital pre-distortion (DPD) processing on the to-be-output signal on which the first AGC processing is performed, to obtain the to-be-output signal on which the DPD processing is performed;
calculating an output power back-off (OBO) value based on the gain value;
adjusting, based on the OBO value, output power of the to-be-output signal on which the DPD processing is performed; and
sending, to a signal receive end, the to-be-output signal on which the output power adjustment is performed.

* * * * *